(12) United States Patent
Agarwal et al.

(10) Patent No.: US 11,469,183 B2
(45) Date of Patent: Oct. 11, 2022

(54) MULTIROW SEMICONDUCTOR CHIP CONNECTIONS

(71) Applicant: ADVANCED MICRO DEVICES, INC., Santa Clara, CA (US)

(72) Inventors: Rahul Agarwal, Santa Clara, CA (US); Milind S. Bhagavat, Broomfield, CO (US)

(73) Assignee: ADVANCED MICRO DEVICES, INC., Santa Clara, CA (US)

(*) Notice: Subject to any disclaimer, the term of this patent is extended or adjusted under 35 U.S.C. 154(b) by 0 days.

(21) Appl. No.: 17/122,571

(22) Filed: Dec. 15, 2020

(65) Prior Publication Data

US 2022/0189879 A1 Jun. 16, 2022

(51) Int. Cl.
*H01L 23/538* (2006.01)
*H01L 23/00* (2006.01)

(52) U.S. Cl.
CPC .......... *H01L 23/5386* (2013.01); *H01L 24/20* (2013.01); *H01L 24/82* (2013.01); *H01L 2224/214* (2013.01)

(58) Field of Classification Search
CPC ... H01L 21/768–76898; H01L 23/5221; H01L 23/5386; H01L 24/20; H01L 24/82; H01L 2224/214
See application file for complete search history.

(56) References Cited

U.S. PATENT DOCUMENTS

| | | | |
|---|---|---|---|
| 2019/0006264 A1* | 1/2019 | Vaidya | H01L 24/06 |
| 2019/0318993 A1* | 10/2019 | Mahajan | H01L 23/5381 |
| 2019/0326221 A1* | 10/2019 | Bhagavat | H01L 21/485 |
| 2021/0066279 A1* | 3/2021 | Yu | H01L 23/5385 |

* cited by examiner

*Primary Examiner* — Selim U Ahmed
*Assistant Examiner* — Evan G Clinton

(57) ABSTRACT

A method of manufacturing a semiconductor device includes mounting an interconnect chip to a redistribution layer structure and mounting a first, second, and third semiconductor chip to the redistribution layer structure, where the second semiconductor chip is interposed between the first and the third semiconductor chips, and the interconnect chip communicatively couples the first, second and third, semiconductor chips to one another.

20 Claims, 8 Drawing Sheets

MULTIROW SEMICONDUCTOR CHIP CONNECTIONS

BACKGROUND

Semiconductor device including multi-chip modules (MCM) combine multiple discrete semiconductor components on a semiconductor device substrate. A MCM can combine multiple individual integrated circuits (IC), or semiconductor chips, to form a large integrated circuit. Heterogeneous integration of the semiconductor chips forming the semiconductor device can be accomplished using interconnect chips to connect various input/output regions of adjacent semiconductor chips.

DETAILED DESCRIPTION

Figure 1:
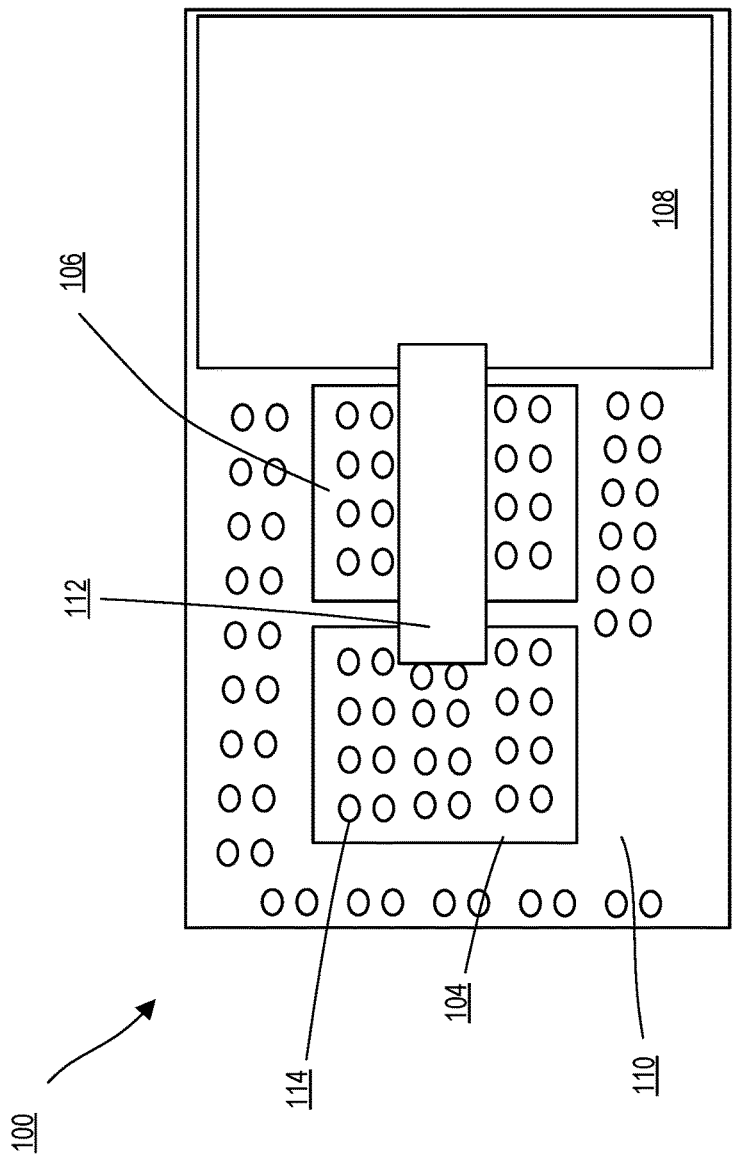
FIG. 1 is a diagram of an overhead view of an example semiconductor device according to some embodiments.

In some embodiments, a method of manufacturing a semiconductor device includes mounting an interconnect chip to a redistribution layer structure. Such a method also includes mounting a first semiconductor chip, a second semiconductor chip, and a third semiconductor chip to the redistribution layer structure. The second semiconductor chip is interposed between the first semiconductor chip and the third semiconductor chip. The interconnect chip communicatively couples the first semiconductor chip, the second semiconductor chip, and the third semiconductor chip to one another.

In some embodiments, the interconnect chip includes a conductive power distribution layer configured to distribute power to the second semiconductor chip. In some embodiments, the interconnect chip includes a plurality of through silicon vias configured to distribute power to the second semiconductor chip. In some embodiments, the interconnect chip includes at least one repeater that communicatively couples the first semiconductor chip to the third semiconductor chip. In some embodiments, the conductive power distribution layer is electrically coupled to a conductive path of the redistribution layer structure.

In some embodiments a first physical device region of the first semiconductor chip is interconnected to the interconnect chip, a second physical device region of the second semiconductor chip is interconnected to the interconnect chip, a third physical device region of the third semiconductor chip is interconnected to the interconnect chip, and a non-physical device region of the second semiconductor chip is electrically coupled to the conductive power distribution layer.

In some embodiments, the method further includes encasing the interconnect chip and a plurality of conductive pillars in a substrate.

In some embodiments, the first semiconductor chip is a core complex die, the second semiconductor chip is a core complex die, and the third semiconductor chip is an input/output die.

In some embodiments, an interconnect chip includes an interconnect layer having a first portion comprising a first plurality of interconnect points configured to electrically couple to a physical device region of a first semiconductor chip, a mid-portion having a second plurality of interconnect points configured to electrically couple to a physical device region of a second semiconductor chip, and a second portion having a third plurality of interconnect points configured to electrically couple to a physical device region of a third semiconductor chip. The mid portion is interposed between the first portion and the second portion. The interconnect chip further includes a plurality of interconnect paths with each interconnect path having a repeater and communicatively coupling an interconnect point of the first plurality of interconnect points to an interconnect point of the third plurality of interconnect points.

In some embodiments, the interconnect chip further includes a plurality of passive interconnect paths. Each passive interconnect path communicatively couples an interconnect point of the first plurality of interconnect points to an interconnect point of the second plurality of interconnect points. In some embodiments, the interconnect chip further includes a power distribution layer located in the mid-portion above at least one interconnect path of the plurality of interconnect paths. The power distribution layer includes a conductive material configured to distribute power to a non-physical device region of the second semiconductor chip. In some embodiments, the conductive material includes a slotted plane of conductive material. In some embodiments, the interconnect chip further includes a plurality of through silicon vias configured to distribute power to a non-physical device region of the second semiconductor chip.

In some embodiments, a semiconductor device includes a redistribution layer, at least three semiconductor chips mounted to the redistribution layer, and an interconnect chip mounted to the redistribution layer. The redistribution layer has a plurality of conductive paths and a plurality of interconnect paths. At least one semiconductor chip of the at least three semiconductor chips is interposed between two other semiconductor chips. The interconnect chip communicatively couples the at least three semiconductor chips to one another.

In some embodiments, the redistribution layer is mounted to a substrate and the substrate includes a plurality of conductive pillars. The redistribution layer includes a plurality of conductive paths in electrical communication with the conductive pillars and a plurality of interconnect paths communicatively coupling the at least three semiconductor chips to the interconnect chip. In some embodiments, each semiconductor chip includes a physical device region interconnected with a portion of the plurality of interconnect paths and a non-physical device region electrically coupled to the plurality of conductive paths. In some embodiments, the conductive material is a slotted plane of conductive material. In some embodiments, the interconnect chip includes a first portion communicatively coupled to the physical device region of a first semiconductor chip of the at least three semiconductor chips, a mid-portion communicatively coupled to the physical device region of a second semiconductor chip of the at least three semiconductor chips, and a second portion communicatively coupled to a physical device region of a third semiconductor chip of the at least three semiconductor chips. The mid portion is interposed between the first portion and the second portion and the first portion is communicatively coupled to the second portion by a plurality of interconnect paths with each interconnect path having a repeater disposed therein. In some embodiments, the interconnect chip further includes a power distribution layer located in the mid-portion above at least one interconnect path of the plurality of interconnect paths. The power distribution layer includes a conductive material configured to distribute power to a non-physical device region of the second semiconductor chip. In some embodiments, the interconnect chip further includes a through silicon via configured to distribute power to a non-physical device region of the at least one semiconductor chip interposed between two other semiconductor chips. In some embodiments, the interconnect chip is embedded in the substrate.

In the figures described below, reference numerals are generally repeated where identical elements appear in more than on figure. Turning now to the figures, FIG. 1 is an overhead view of a non-limiting example semiconductor device 100 in accordance with embodiments of the invention. The example semiconductor device 100 can be implemented in a variety of computing devices, including personal computers, server computers, smart phones, mobile devices, personal computers, peripheral hardware components, video-capable cameras, and the like. The semiconductor device 100 includes a first semiconductor chip 104, a second semiconductor chip 106, and a third semiconductor chip 108 mounted above a semiconductor device substrate 110. In other examples, the semiconductor device 100 can have more than three semiconductor chips. The semiconductor chips 104, 106, 108 include one or more integrated circuits such as microprocessors, graphics processing units, application processing units that combine aspects of both microprocessors and graphics processing units, memory devices, application specific integrated circuit, input/output dies, graphics cores, memory modules, and the like. The semiconductor device substrate 110 can be a conventional substrate material such as crystalline silicon or can be a mold layer as described in U.S. Pat. No. 10,593,628 issued on Mar. 17, 202 and which is herein incorporated by reference. The semiconductor chips 104, 106, 108 can be secured to the semiconductor device substrate 110 and arranged in line with the second semiconductor chip 106 interposed between the first semiconductor chip 104 and the third semiconductor chip 108.

The semiconductor chips 104, 106, 108 each communicate to one another through an interconnect chip 112. As described below, the interconnect chip 112 includes conductive traces that transmit electrical signals between input/output region of each semiconductor chips 104, 106, 108. A conventional interconnect chip can require relatively short conductive traces to reliably transmit high bandwidth parallel signals. The interconnect chip 112 described below can include longer conductive traces than a traditional interconnect chip and can therefore span a longer distance. Because the interconnect chip 112 can span a longer distance, it can interconnect semiconductor chips that are not adjacent to one another, such as the first semiconductor chip 104 and the second semiconductor chip 108. Traditionally, an interconnect chip is relatively short and is only able to interconnect semiconductor chips adjacent to one another.

Figure 2:
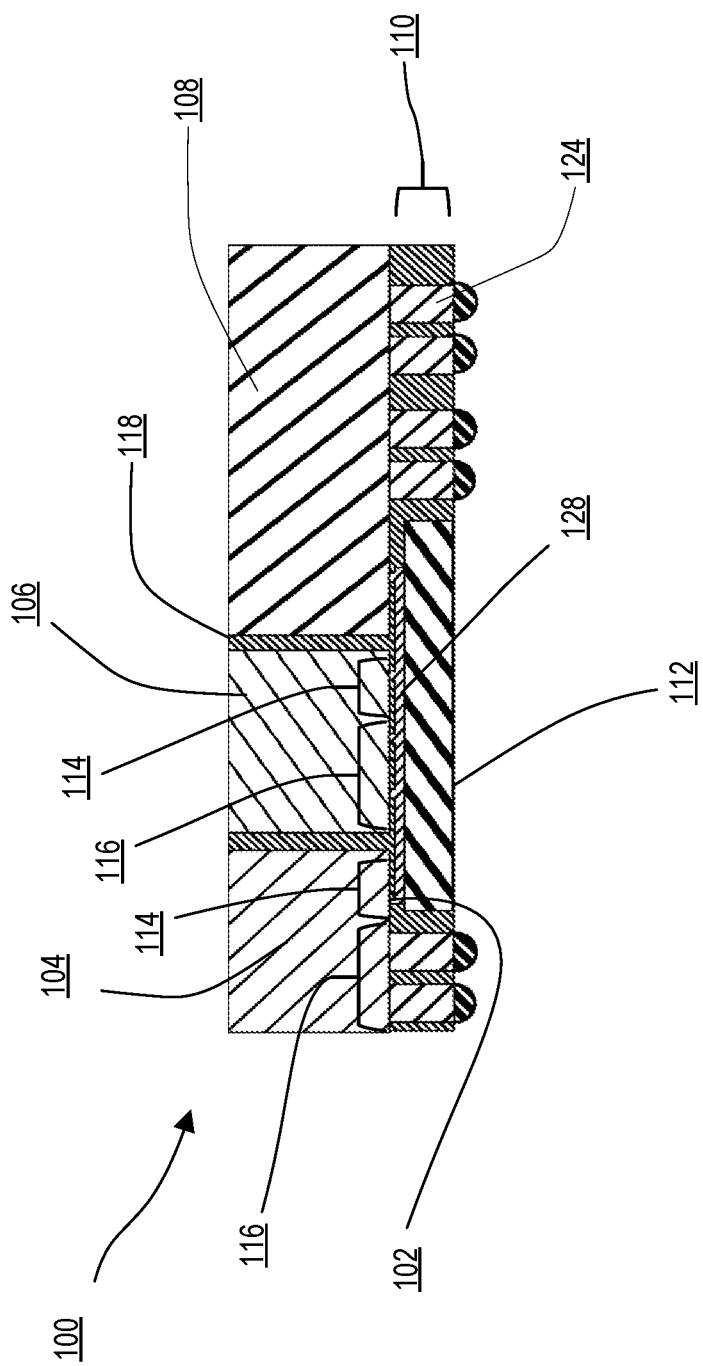
FIG. 2 is a diagram of a cross section of an example semiconductor device according to some embodiments.

FIG. 2 illustrates a cross section of the example semiconductor device 100. The semiconductor chips 104, 106, 108 are mounted to a redistribution layer (RDL) structure 136 (see FIGS. 4 and 5) and are electrically interconnected to one another by the RDL structure 136 in conjunction with an interconnect chip 112. An RDL structure is a conductive layer on a semiconductor device that makes the input output pads of an integrated circuit available in other locations of the chip. For example, the input output pads of an integrated circuit may have tight spacing to conform to the physical size of the integrated circuit and a respective RDL structure can distribute the input output pads to have larger spacing between the input output pads. The semiconductor chips 104, 106, 108 can be encased in a mold layer 118 to provide protection for the semiconductor chips 104, 106, 108 Each of the semiconductor chips 104, 106, 108 includes a substrate layer and an interconnect layer. The substrate layer includes multitudes of logic and other circuits and can consist of silicon, germanium, or other types of semiconductor materials, and can include various dielectric materials. The interconnect layer provides an electrical connection to the multitudes of logic and circuits in the substrate layer and includes of one or more layers of metallization and interlevel dielectric materials.

Each of the semiconductor chips 104, 106, 108 is constructed with a physical device or "PHY" region 114 and a non-PHY region. The PHY region 114 of each of the semiconductor chips includes various internal and external conductor structures dedicated to the transmission of chip-to-chip signals. The non-PHY region 116 of each of the semiconductor chips 104, 106, 108 includes conductor structures that are tailored to the conveyance of power and ground as well as chip-to-circuit board signals. The PHY regions 114 can be located near an edge of the semiconductor chip to reduce the path length between semiconductor chips while the non-PHY region 116 can be located near the center of the semiconductor chip because the power and ground circuits are not as sensitive to path length as the signal circuits.

The example of FIG. 2 illustrates a cross section of the semiconductor device 100. The semiconductor device substrate 110 includes conductive pillars 124 that deliver power to the non-PHY regions of the semiconductor chips 104, 106, 108. The second semiconductor chip 106 is mounted over the interconnect chip 112 (i.e., in the shadow of the interconnect chip) and at least one conductor structure of the non-PHY region of the second semiconductor chip 106 is blocked from directly connecting to a conductive pillar 124. As will be shown in FIG. 4, the second semiconductor chip 106 receives power by a thick conductive power distribution layer 128 in place of receiving power directly from a conductive pillar 124. A thick conductive power distribution layer 128 is a conductive layer that is thicker than a conductive layer of the RDL structure 136. In some embodiments, the thick conductive power distribution layer 128 can be at least 15 micrometers thick, or at least twice the thickness of a conductive layer of the RDL structure 136.

The distance between the first semiconductor chip 104 and the third semiconductor chip 108 is greater than the distance between the first semiconductor chip 104 and the second semiconductor chip 106, and the second semiconductor chip 106 and the third semiconductor chip 108. The increased distance between the first semiconductor chip 104 and the third semiconductor chip 108 results in a path length that can be too long for a conventional conductive trace in an interconnect chip. As will be described in relation to FIG. 5, the interconnect chip 112 may include at least one repeater in a conductive trace to enable the transmission of signals between the first semiconductor chip 104 and the third semiconductor chip 108. The combination of the thick conductive power distribution layer 128 and the repeater enables the interconnect chip 112 to be located under the second semiconductor chip 106.

Figure 3:
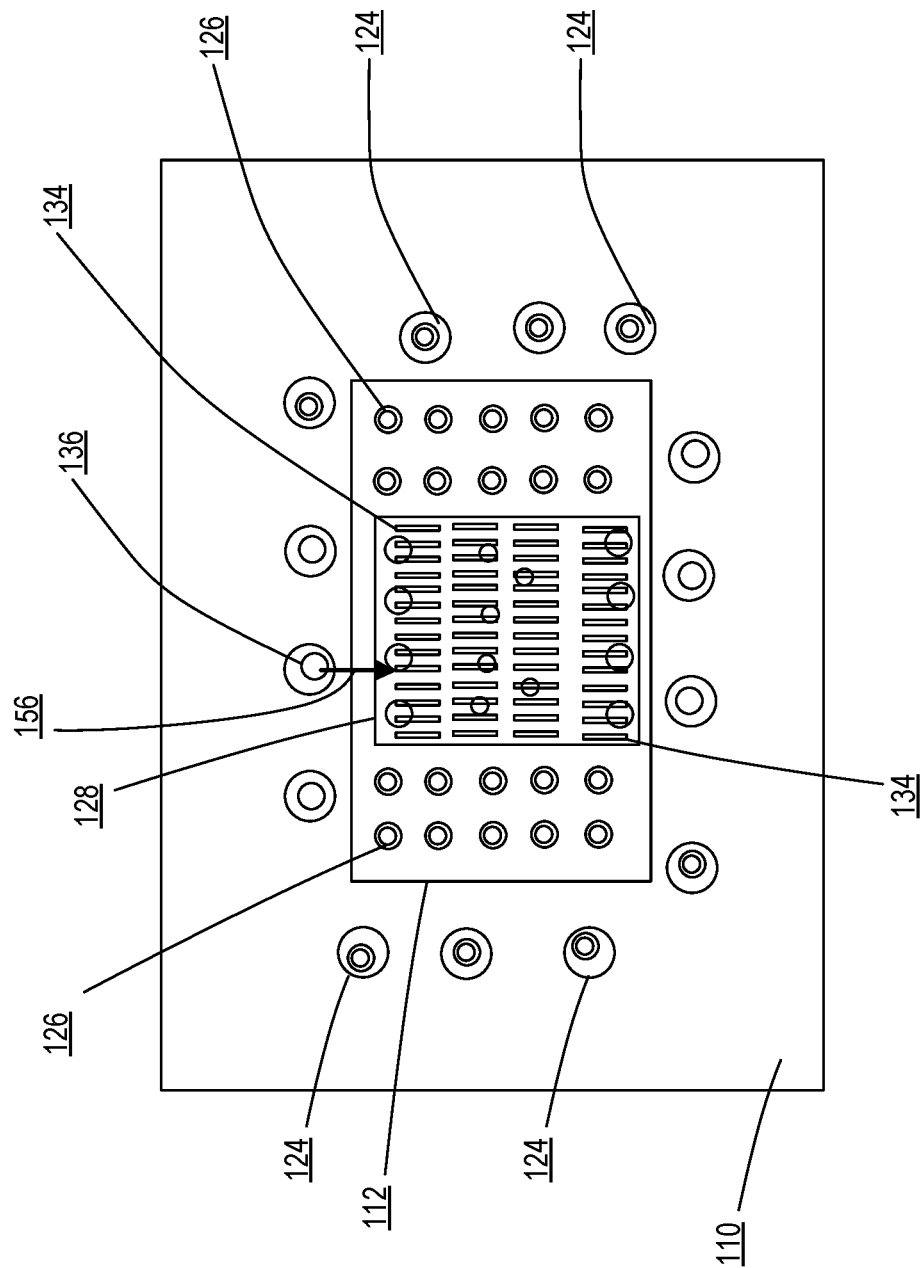
FIG. 3 is a diagram of a cross section of an example semiconductor device according to some embodiments.

FIG. 3 illustrates a top view of the semiconductor device substrate 110 of an example semiconductor device 100 just below the RDL structure 136. The semiconductor device substrate 110 has conductive pillars 124 that provide an electrical pathway from a first side of the semiconductor device substrate 110 to a second side of the semiconductor device substrate 110 opposite the first side. The conductive pillars 124 form power and ground connections for a semiconductor chip mounted above the semiconductor device substrate 110. The interconnect chip 112 has interconnect points 126 electrically coupled to conductive traces 150 (see FIGS. 3 and 4) within the interconnect chip 112 that transmit signals between the semiconductor chips 104, 106, 108. The conductive traces 150 form a portion of an interconnect path between the semiconductor chips. The interconnect points 126 are configured to electrically couple to a PHY region of a semiconductor device using conventional techniques. For example, the interconnect points can be electrically coupled to the PHY region through the RDL structure. As shown in FIG. 3, the interconnect chip 112 includes a thick conductive power distribution layer 128 for distributing power laterally above the interconnect chip 112. The thick conductive power distribution layer 128 is formed of a conductive material. In some examples, the thick conductive power distribution layer 128 can be formed of copper and can be between 15 and 20 micrometers thick. The thick conductive power distribution layer 128 distributes power from the lateral edges of the interconnect chip 112 to the center of the interconnect chip 112. The thick conductive power distribution layer 128 can be formed as a slotted plane having a plurality of slots 134 as shown in FIG. 3. Power can be distributed from at least one conductive pillar, such as conductive pillar 124, to the thick conductive power distribution layer 128 through the RDL structure 136, as will be shown in FIG. 4. The thick conductive power distribution layer 128 can then be used to power the second semiconductor chip 106 positioned above the interconnect chip 112.

Figure 4:
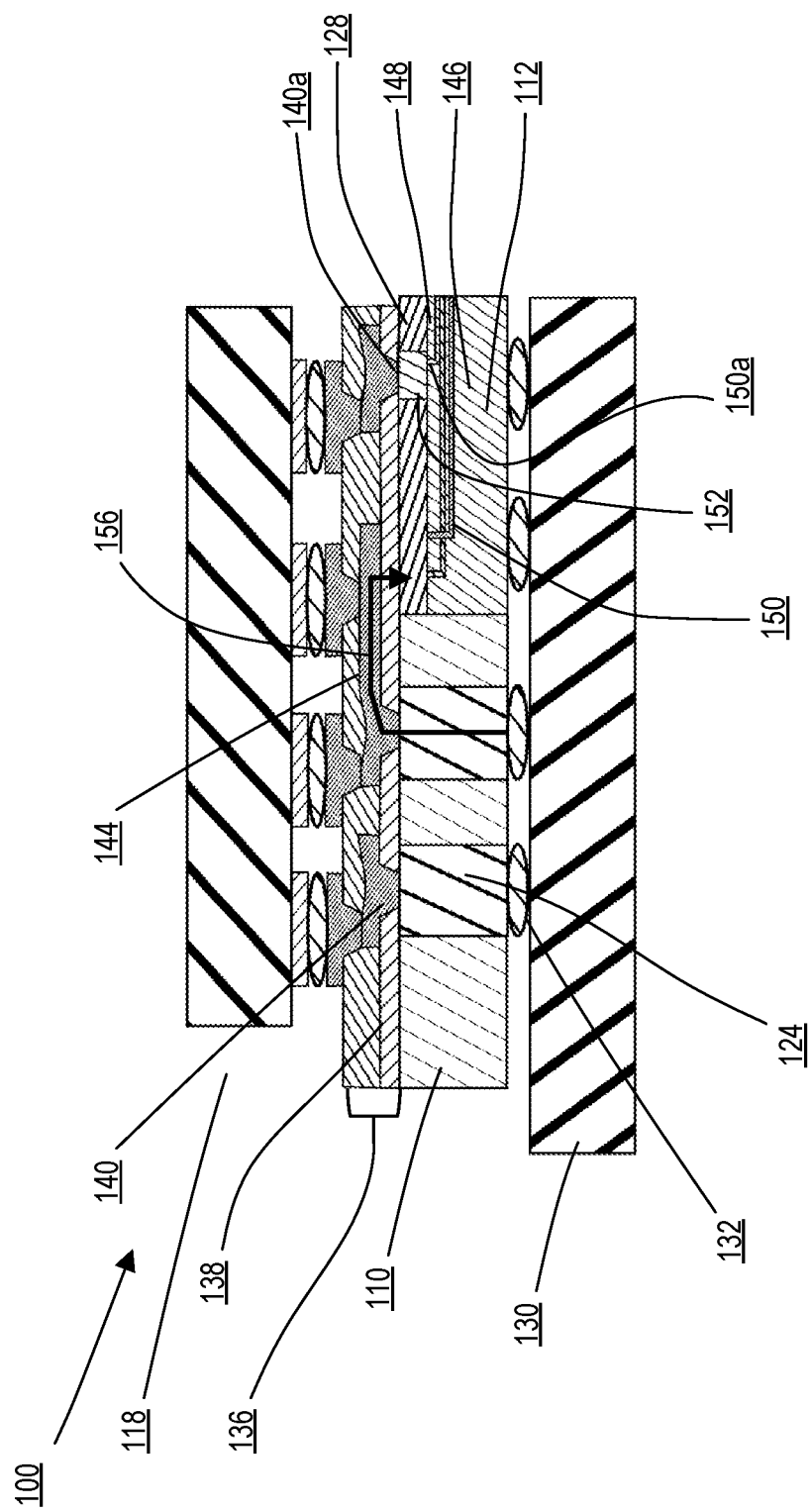
FIG. 4 is a diagram of a cross section taken traverse to an interconnect device of an example semiconductor device according to some embodiments.
Figure 5:
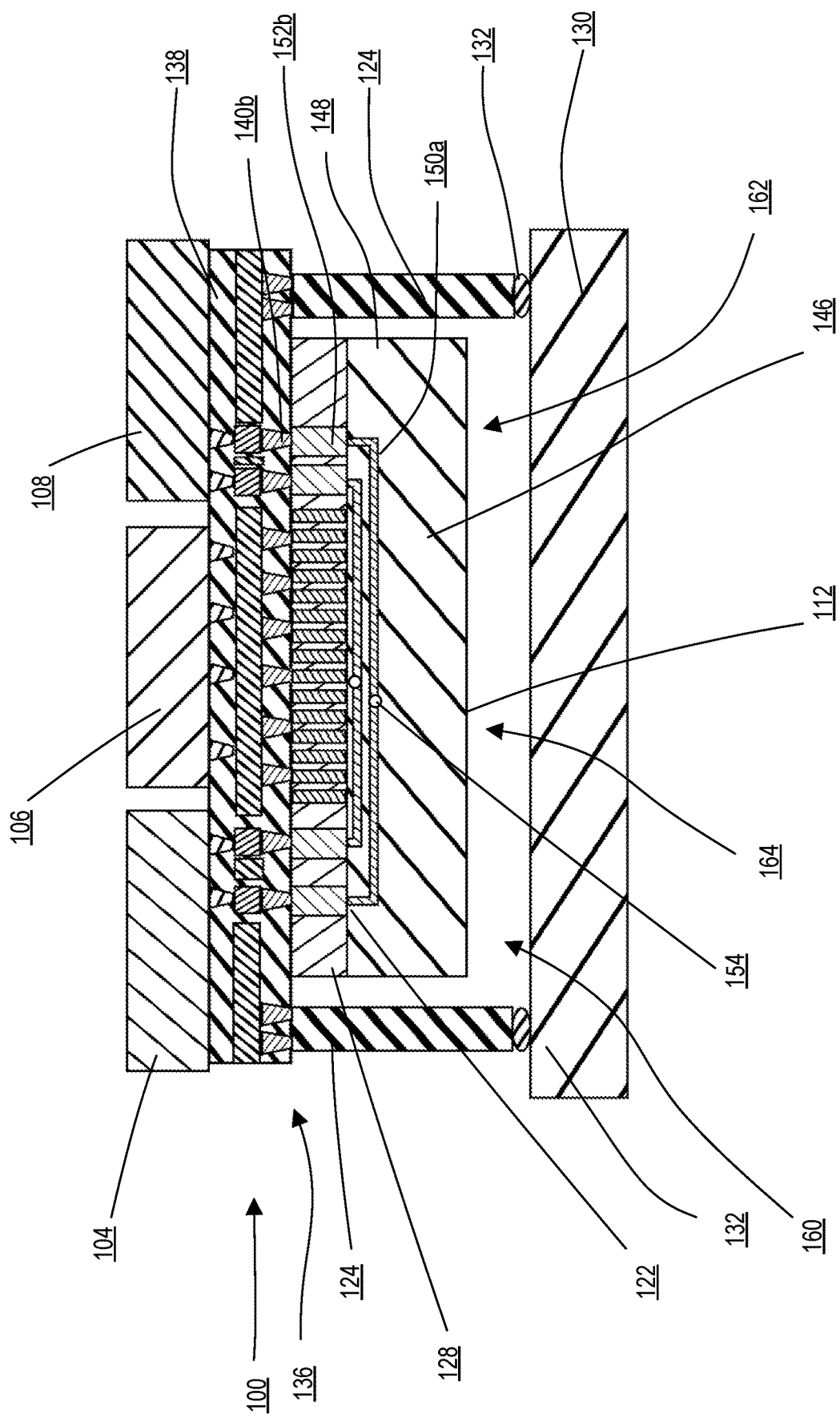
FIG. 5 is a diagram of a cross section taken along an interconnect device of an example semiconductor device according to some embodiments.

FIG. 4 illustrates a diagram of a partial cross section of the semiconductor device 100 taken transverse to the length of the interconnect chip 112 and mounted on a circuit board 130. FIG. 5 illustrates a diagram of a partial cross section of the semiconductor device 100 taken along the length of the interconnect chip 112. Referring to FIGS. 4 and 5, the circuit board 130 has a plurality of interconnect structures 132 that supply power to the semiconductor device 100. The conductive pillars 124 of the semiconductor device 100 are electrically coupled to the interconnect structures 132 using common techniques such as controlled collapse chip connection (C4). The RDL structure 136 is located above the conductive pillars 124 and the interconnect chip 112. The RDL structure 136 includes one or more dielectric layers 138 and various conductive structures.

The dielectric layers can be comprised of polybenzoxazoles, although other polymeric materials could be used, such as benzocyclobutene, high or low temperature polyimide or other polymers. The dielectric layers 138 can act as a stress buffer, an isolation film, and can enable the RDL structure 136 to route of power and signals between the semiconductor device substrate 110 and the semiconductor chips 104, 106, 108 by way of a conductive path through the RDL structure 136. For example, the RDL structure 136 includes a plurality of interconnect structures 140 extending generally vertical in the RDL structure 136 and a plurality of conductor structures 144 extending generally horizontally in the RDL structure 136.

The plurality of conductor structures 144 can be interconnected to some of the interconnect structures 140 to form conductive paths. The interconnect structures 140 can be pillars, vias or multitudes of vias and other types of interconnecting traces, etc. The conductor structures 144 can be conductor traces. The interconnect structures 140 and the conductor structures 144 are fabricated with design rules for small spacings associated with the input/ouput ('I/O') mappings of the semiconductor chips. The RDL structure 136 allows the small spacing associated with the I/O mappings of the semiconductor chips to transition to other spacings associated with the circuit board 130, the interconnect chip 112, and other devices.

The interconnect chip 112 is mounted to the RDL structure 136 using conventional methods such as those described in the '628 patent. In some examples, the interconnect chip 112 can be embedded in the semiconductor device substrate 110. Thus, the process of mounting the semiconductor device substrate 110 to the RDL structure can effectively include mounting the interconnect chip 112 to the RDL structure 136. Furthermore, in some examples the RDL structure 136 can be formed on top of the semiconductor device substrate 110 including the interconnect chip 112. In such examples, the process of forming the RDL structure 136 on the interconnect chip 112 is considered to be mounting the interconnect chip 112 to the RDL structure 136.

In addition to the previously described thick conductive power distribution layer 128, the interconnect chip 112 further includes a substrate layer 146 and an interconnect layer 148. The interconnect layer 148 is located below the thick conductive power distribution layer 128 and above the substrate layer 146. The interconnect layer 148 includes a plurality of interconnect paths including conductive traces 150 for transmitting signals between semiconductor chips. The conductive traces 150 can be on multiple levels or a single level.

The interconnect chip 112 can be generally divided into at least three portions. A first portion 160 can have interconnect points 126 in communication with the PHY region of the first semiconductor chip 104, a second portion 162 can have interconnect points 126 in communication with the PHY region of the third semiconductor chip 108, and a mid-portion 164 interposed between the first portion 160 and the second portion 162 and having interconnect points 126 in communication with the PHY region of the second semiconductor chip 106.

The interconnect paths associated with the mid portion can be passive interconnect paths using conductive traces 150 since they have a relatively short path to the adjacent first semiconductor chip 104 and third semiconductor chip 108. However, interconnect paths that are not associated with the midportion, such as an interconnect path connecting the first semiconductor chip 104 to the third semiconductor chip 108 are active interconnect paths that include a repeater 154 between conductive traces 150.

A repeater as the term is used in this specification refers to an active electrical component that receives an electrical signal and retransmits it. An example of a repeater includes an inverter as known in the art. The repeater 154 divides the interconnect path into multiple serial conductive traces with each serial conductive trace having a shorter length than the overall length of the interconnect path. The time it takes for a signal to travel from one end of a conductive trace to the other end is approximately dependent on the square of the conductive trace's length. Therefore, dividing the interconnect path into multiple conductive traces reduces the overall delay of the signal transmitted over the interconnect path relative to an interconnect path having a single conductive trace. Thus, having a repeater 154 in the interconnect chip 112 enables the interconnect paths to communicately couple chips using an interconnect path longer than would be possible using an uninterrupted conductive trace in an interconnect chip 112.

The conductive traces 150 of the interconnect chip 112 interface electrically with conductor structures of the PHY regions 114 of the semiconductor chips by way of conducting pathways. The interconnect layer 148 of the interconnect chip 112 is connected to some of the interconnect structures 140 for communicating with the semiconductor chips. For example, in FIG. 4 interconnect structure 140a is connected to a trace 150a in the interconnect layer 148 by way of conductive stud 152. In FIG. 5 interconnect structure 140b is connected to trace 150b in the interconnect layer 148 by way of conductive stud 152b. In some examples, the conductive stud 152 can be comprised of copper. The conductive stud 152 can be located around a perimeter of the thick conductive power distribution layer 128, or in some examples, the conductive stud 152 can pass through a slot 134 in the thick conductive power distribution layer 128.

The thick conductive power distribution layer 128 can be electrically coupled to a power source by a combination of an interconnect structures 140 and conductor structures 144. For example, a conductive pillar 124 can deliver power to an interconnect structure 140, conducted vertically through the interconnect structure 140 to a conductor structure 144, conducted horizontally through the conductor structure 144 to an area above the interconnect chip 112, and then conducted vertically through another interconnect structure (not shown in the section of FIG. 4) to the thick conductive power distribution layer 128. The general path that the power flows from the conductive pillar 124 to the thick conductive power distribution layer 128 is shown by path 156 in FIGS. 3 and 4.

In some examples, the first semiconductor chip 104 and the second semiconductor chip 106 can be duplicate semiconductor chips that each have the same layout of one or more integrated circuits. The electrical connection for each of the first semiconductor chip 104 and the second semiconductor chip 106 can have the same physical connection as one another. Thus, although the semiconductor chips 104, 106 can be in different locations on the semiconductor device substrate 110 and receive power in a different manner, they can be duplicate semiconductor chips.

Figure 6:
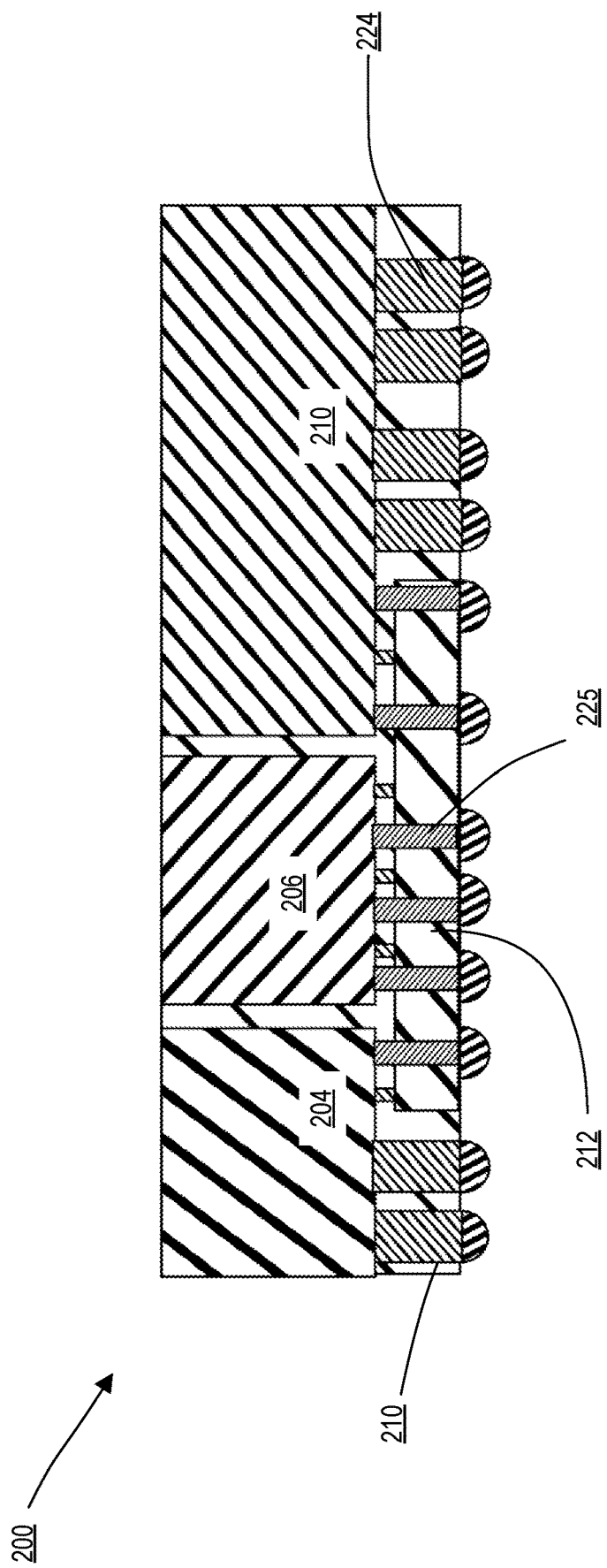
FIG. 6 is a diagram of a cross section of an example semiconductor device according to some embodiments.

FIG. 6 illustrates a cross section of a non-limiting example semiconductor device 200 in accordance with embodiments of the invention. The first semiconductor chip 204, the second semiconductor chip 206, and the third semiconductor chip 208 can each be the same as first semiconductor chip 104, second semiconductor chip 106, and third semiconductor chip 108 respectively of FIG. 2.

Like semiconductor device 100, semiconductor device 200 includes semiconductor device substrate 210. Semiconductor device substrate 210 include conductive pillars 224 that deliver power to the non-PHY regions of the semiconductor chips 204, 206, 208.

In the example of FIG. 6, the second semiconductor chip 206 is mounted over an interconnect chip 212 (i.e., in the shadow of the interconnect chip). In contrast to the example embodiment shown in FIG. 2, the example embodiment of FIG. 6 includes through silicon vias (TSV) allowing at least one conductive pillar 225 to pass through the interconnect chip 212 and deliver power directly to the second semiconductor chip 206. In some examples, a combination of the examples of FIGS. 2 and 6 can include a TSV as shown in FIG. 6 and a conductive power distribution layer 128 as shown in FIG. 4. Thus, a single TSV can deliver power directly to a power distribution layer which can then deliver power to the second semiconductor chip as described in relation to FIG. 4. The flow of signals from each semiconductor chip 204, 206, 208 is otherwise the same as that described in relation to FIG. 5 and will not be repeated.

In the example of FIG. 6, the interconnect chip 212 may also include at least one repeater in a conductive trace to enable the transmission of signals between the first semiconductor chip 204 and the third semiconductor chip 208. The at least one repeater enables the conductive trace to extend farther than a conductive trace without a repeater. Thus, the combination of the TSV and the repeater enables the interconnect chip 212 to be located under the second semiconductor chip 206 since the TSV is able to deliver power to the second semiconductor chip 206 through the interconnect chip 212 and the use of the repeater enables the conductive trace to span the length of the second semiconductor chip 206.

Figure 7:
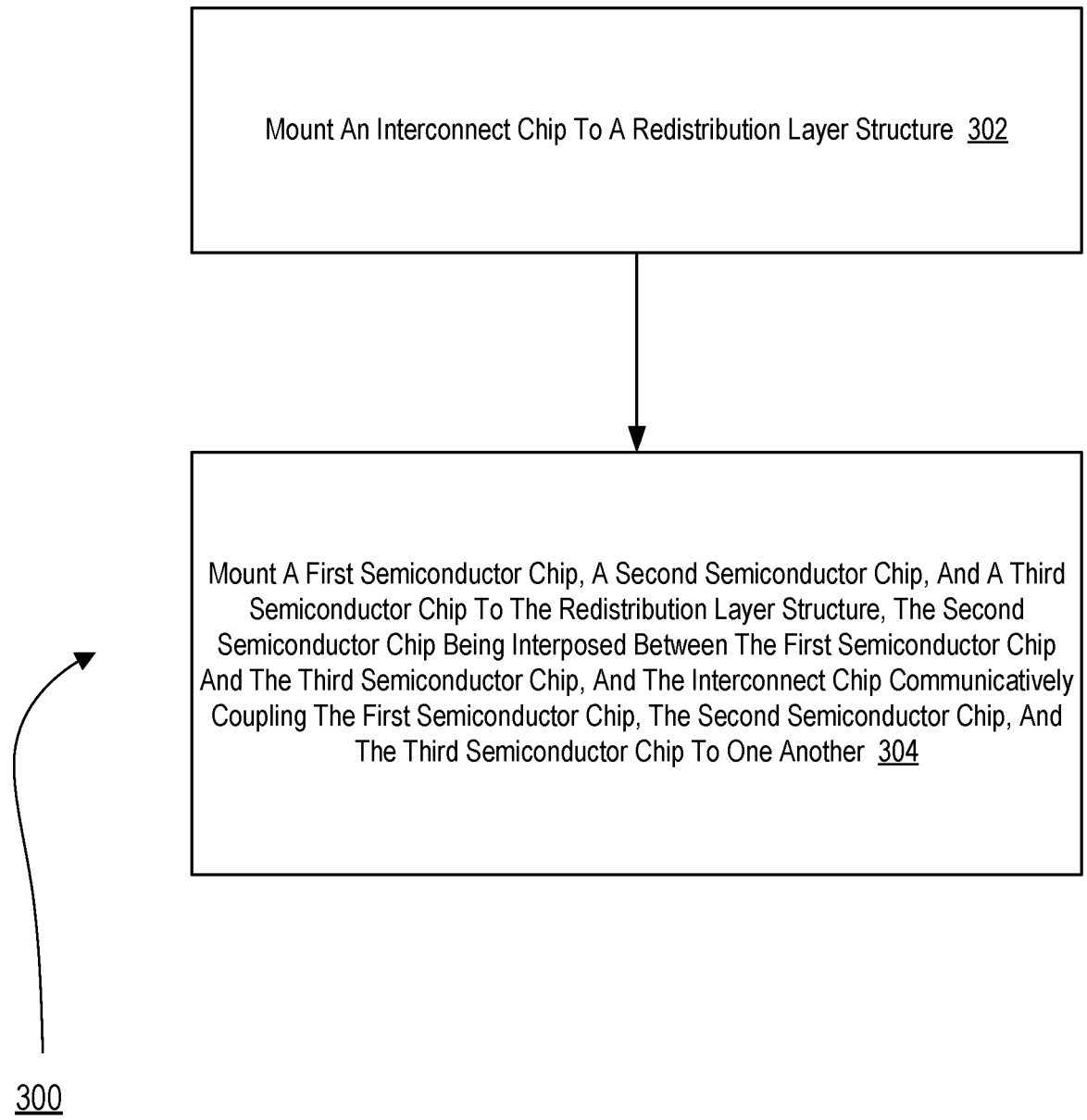
FIG. 7 is a flowchart of an example method for manufacturing a semiconductor device according to some embodiments.

FIG. 7 illustrates a flowchart of a non-limiting example method 300 of manufacturing a semiconductor device (e.g., the semiconductor devices 100, 200 of FIGS. 1 through 6). The method includes mounting 302 an interconnect chip to a RDL structure. Mounting 302 an interconnect chip to an RDL structure may be carried out using conventional techniques as known in the art. For example, the interconnect chip may be mounted to the RDL structure using hybrid bonding. For example, referring to FIGS. 4 and 5, the method can include mounting the interconnect chip 112 to the RDL structure 136. Mounting the interconnect chip to the RDL structure 136 can include electrically connecting the at least one interconnect structure 140 to at least one conductive trace in the interconnect chip 112.

The method 300 of FIG. 7 further includes mounting 304 a first semiconductor chip, a second semiconductor chip, and a third semiconductor chip to the RDL structure, the second semiconductor chip being interposed between the first semiconductor chip and the third semiconductor chip, and the interconnect chip communicatively coupling the first semiconductor chip, the second semiconductor chip, and the third semiconductor chip to one another. Mounting 304 the first, second, and third semiconductor chips to the RDL structure may be carried out using conventional techniques as known in the art, such as hybrid bonding. For example, referring to FIGS. 4 and 5, the method 300 can include mounting the first semiconductor chip 104, the second semiconductor chip 106, and the third semiconductor chip 108 to the RDL structure 136. Each semiconductor chip 104, 106, 08 is communicately coupled to the interconnect chip through the RDL structure as described in relation to FIG. 5.

Figure 8:
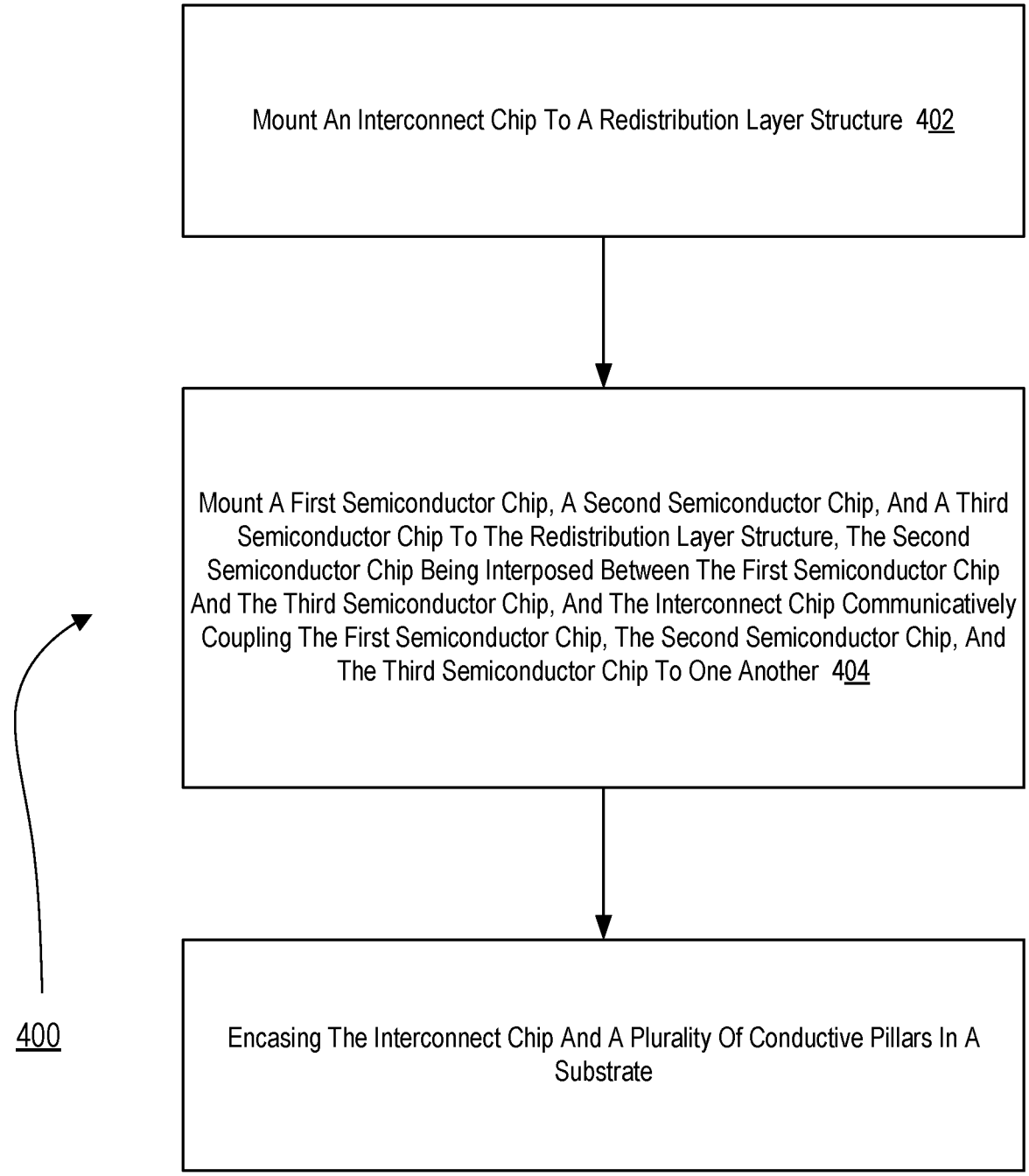
FIG. 8 is a flowchart of an example method for manufacturing a semiconductor device according to some embodiments.

FIG. 8 illustrate a flowchart of a non-limiting example method 400 of manufacturing a semiconductor device (e.g., the semiconductor devices 100, 200 of FIGS. 1 through 6). The method includes mounting 402 an interconnect chip to a RDL and mounting 404 a first semiconductor chip, a second semiconductor chip, and a third semiconductor chip to the RDL structure as described previously in relation to FIG. 7. The method further includes encasing 406 the interconnect chip and a plurality of conductive pillars in a substrate. For example, referring to FIG. 4, interconnect chip 112 and pillars 124 can be encased by substrate 110. The substrate 110 may encase the interconnect chip 112 and pillars 124 using conventional techniques as known in the art. In some examples, the substrate 110 can be a mold material that is molded around the interconnect chip 112 and the pillars 124. In some examples, the substrate 110 can have a recess machined therein to receive the interconnect chip. In some examples, the substrate can have vertical vias machined therein and filled with conductive material to form the pillars 124.

In some examples, mounting each semiconductor chip to the RDL structure can include electrically coupling at least one connector from the PHY region 114 of a respective semiconductor chip to at least one interconnect structure 140 of the RDL structure 136 in electrical communication with the interconnect chip 112 mounted to the RDL structure 136. Electrically coupling a connector from the PHY region 114 of a semiconductor chip to an interconnect structure 140 of the RDL structure 136 may be carried out through the use of solder micro bumps or other conventional techniques as known in the art. For example, a micro solder bump may be positioned between a connector of the PHY region 114 and an interconnect structure 140 and reflowed to electrically coupled the connector and the interconnect structure. The electrical couplings of the at least one connector from the PHY region 114 of each respective semiconductor chip can communicatively couple the first, second, and third semiconductor chips to one another.

In some examples, mounting each semiconductor chip to the RDL structure can further comprise electrically coupling a non-PHY region of the second semiconductor chip 106 to a power distribution layer of the interconnect chip. For example, referring to FIGS. 4 and 5, the second semiconductor chip 106 can be electrically coupled to the thick conductive power distribution layer 128 by way of an interconnect structure 140 of the RDL structure 136. Additionally, the thick conductive power distribution layer 128 can be electrically coupled to a power source by a combination of interconnect structures 140 and conductor structures 144.

The flowchart and block diagrams in the Figures illustrate the architecture, functionality, and operation of possible implementations of systems and methods according to various embodiments of the present disclosure. In some alternative implementations, the functions noted in the block can occur out of the order noted in the Figures. For example, two blocks shown in succession can, in fact, be executed substantially concurrently, or the blocks can sometimes be executed in the reverse order, depending upon the functionality involved.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of manufacturing a semiconductor device, comprising:
    mounting an interconnect chip to a redistribution layer structure; and
    mounting a first semiconductor chip, a second semiconductor chip, and a third semiconductor chip to the redistribution layer structure, the second semiconductor chip being interposed between the first semiconductor chip and the third semiconductor chip, and the interconnect chip communicatively coupling the first semiconductor chip, the second semiconductor chip, and the third semiconductor chip to one another, wherein the interconnect chip comprises a conductive power distribution layer configured to distribute power to a non-physical device region of the second semiconductor chip.

2. The method of claim 1, wherein the interconnect chip comprises a plurality of through silicon vias configured to distribute power to the second semiconductor chip.

3. The method of claim 1, wherein the interconnect chip comprises at least one repeater communicatively coupling the first semiconductor chip to the third semiconductor chip.

4. The method of claim 1, wherein the conductive power distribution layer is electrically coupled to a conductive path of the redistribution layer structure.

5. The method of claim 1, wherein a first physical device region of the first semiconductor chip is interconnected to the interconnect chip, a second physical device region of the second semiconductor chip is interconnected to the interconnect chip, a third physical device region of the third semiconductor chip is interconnected to the interconnect chip, and the non-physical device region of the second semiconductor chip is electrically coupled to the conductive power distribution layer.

6. The method of claim 1, further comprising encasing the interconnect chip and a plurality of conductive pillars in a substrate.

7. The method of claim 1, wherein the first semiconductor chip is a core complex die, the second semiconductor chip is a core complex die, and the third semiconductor chip is an input/output die.

8. An interconnect chip, comprising:
    an interconnect layer having a first portion comprising a first plurality of interconnect points configured to electrically couple to a physical device region of a first semiconductor chip, a mid-portion comprising a second plurality of interconnect points configured to electrically couple to a physical device region of a second semiconductor chip, and a second portion comprising a third plurality of interconnect points configured to electrically couple to a physical device region of a third semiconductor chip, wherein the mid portion is interposed between the first portion and the second portion;
    a plurality of interconnect paths, each interconnect path comprising a repeater and communicatively coupling an interconnect point of the first plurality of interconnect points to an interconnect point of the third plurality of interconnect points; and
    a power distribution layer comprising a conductive material configured to distribute power to a non-physical device region of the second semiconductor chip.

9. The interconnect chip of claim 8, further comprising a plurality of passive interconnect paths, each passive interconnect path communicatively coupling an interconnect point of the first plurality of interconnect points to an interconnect point of the second plurality of interconnect points.

10. The interconnect chip of claim 8, wherein the power distribution layer located in the mid-portion above at least one interconnect path of the plurality of interconnect paths.

11. The interconnect chip of claim 10, wherein the conductive material comprises a slotted plane of conductive material.

12. The interconnect chip of claim 8, further comprising a plurality of through silicon vias configured to distribute power to the non-physical device region of the second semiconductor chip.

13. A semiconductor device, comprising:
a redistribution layer having a plurality of conductive paths and a plurality of interconnect paths;
at least three semiconductor chips mounted to the redistribution layer with at least one semiconductor chip interposed between two other semiconductor chips; and
an interconnect chip mounted to the redistribution layer, the interconnect chip communicatively coupling the at least three semiconductor chips to one another wherein the interconnect chip comprises a power distribution layer configured to distribute power to a non-physical device region of one of the semiconductor chips.

14. The semiconductor device of claim 13, wherein the redistribution layer is mounted to a substrate, the substrate comprises a plurality of conductive pillars, and the redistribution layer comprises a plurality of conductive paths in electrical communication with the conductive pillars and a plurality of interconnect paths communicatively coupling the at least three semiconductor chips to the interconnect chip.

15. The semiconductor device of claim 14, wherein each semiconductor chip comprises a physical device region interconnected with a portion of the plurality of interconnect paths and a non-physical device region electrically coupled to the plurality of conductive paths.

16. The semiconductor device of claim 15, wherein the interconnect chip comprises a first portion communicatively coupled to the physical device region of a first semiconductor chip of the at least three semiconductor chips, a mid-portion communicatively coupled to the physical device region of a second semiconductor chip of the at least three semiconductor chips, and a second portion communicatively coupled to a physical device region of a third semiconductor chip of the at least three semiconductor chips, wherein the mid portion is interposed between the first portion and the second portion, wherein the first portion is communicatively coupled to the second portion by a plurality of interconnect paths, each interconnect path having a repeater disposed therein.

17. The semiconductor device of claim 16, wherein the interconnect chip is located in the mid-portion above at least one interconnect path of the plurality of interconnect paths, the power distribution layer comprising a conductive material configured to distribute power to a non-physical device region of the second semiconductor chip.

18. The semiconductor device of claim 13, wherein the interconnect chip further comprises a through silicon via configured to distribute power to a non-physical device region of the at least one semiconductor chip interposed between two other semiconductor chips.

19. The semiconductor device of claim 14, wherein the interconnect chip is embedded in the substrate.

20. The semiconductor device of claim 17, wherein the conductive material comprises a slotted plane of conductive material.

* * * * *